United States Patent
Im

(10) Patent No.: US 8,116,132 B2
(45) Date of Patent: Feb. 14, 2012

(54) FLASH MEMORY DEVICE CONFIGURED TO SWITCH WORDLINE AND INITIALIZATION VOLTAGES

(75) Inventor: Jae-woo Im, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 11 days.

(21) Appl. No.: 12/348,348

(22) Filed: Jan. 5, 2009

(65) Prior Publication Data

US 2009/0185418 A1    Jul. 23, 2009

(30) Foreign Application Priority Data

Jan. 18, 2008    (KR) .................. 10-2008-0005790

(51) Int. Cl.
*G11C 11/34*    (2006.01)
(52) U.S. Cl. ......... 365/185.03; 365/185.18; 365/185.23; 365/189.15
(58) Field of Classification Search ............. 365/185.03, 365/185.15
See application file for complete search history.

(56) References Cited

U.S. PATENT DOCUMENTS

| | | | |
|---|---|---|---|
| 6,240,014 B1 | 5/2001 | Yoo | |
| 7,545,675 B2 * | 6/2009 | Kamei | ............... 365/185.18 |
| 2007/0047300 A1 * | 3/2007 | Lee et al. | ............... 365/185.03 |

FOREIGN PATENT DOCUMENTS

| | | |
|---|---|---|
| JP | 10-011979 | 1/1998 |
| KR | 1019990066678 A | 8/1999 |
| KR | 1020010003222 A | 1/2001 |

* cited by examiner

*Primary Examiner* — Hoai V Ho
*Assistant Examiner* — Anthan Tran
(74) *Attorney, Agent, or Firm* — Volentine & Whitt, PLLC

(57) ABSTRACT

Provided is a flash memory device including a wordline voltage generating unit, a switch unit, a row decoder and a control circuit. The wordline voltage generating unit generates at least one wordline voltage for read operations of a multi-level cell in the flash memory device. The switch unit receives the at least one wordline voltage and an initialization voltage, and selectively outputs the at least one wordline voltage and the initialization voltage through a switching operation. The row decoder operates the wordline of the multi-level cell based on an output of the switch unit. The control circuit provides at least one control signal to the switch unit, which outputs the initialization voltage in at least one section of the read operation in response to the at least one control signal.

18 Claims, 7 Drawing Sheets

FLASH MEMORY DEVICE CONFIGURED TO SWITCH WORDLINE AND INITIALIZATION VOLTAGES

CROSS-REFERENCE TO RELATED PATENT APPLICATION

A claim of priority is made to Korean Patent Application No. 10-2008-0005790, filed on Jan. 18, 2008, in the Korean Intellectual Property Office, the subject matter of which is hereby incorporated by reference.

BACKGROUND

1. Field of the Invention

The present invention relates to a memory device, and more particularly, to a flash memory device capable of switching wordline and initialization voltages.

2. Description of the Related Art

Flash memory devices are typically used as non-volatile memory devices capable of electrically and repeatedly having data recorded and deleted. Flash memory devices consume less electricity than magnetic disk based storage mediums, and have fast access times like hard disks.

Flash memory devices can be classified as NOR type or NAND type, according to the connection configuration between cells and bit lines. In a NOR type flash memory, two or more cell transistors are connected parallel to one bit line, and data is stored using a channel hot electron method and data is deleted using a Fowler-Nordheim (F-N) tunneling method. In a NAND type flash memory, two or more cell transistors are serially connected to one bit line and data is stored or deleted using an F-N tunneling method. In general, NOR type flash memory devices have relatively large electrical consumption and thus are not suitable for highly integrated devices, but have quick response times. In contrast NAND type flash memories use smaller cell current and are suitable for highly integrated devices.

FIG. 1A is a circuit diagram illustrating a memory cell structure of a general NAND type flash memory. In FIG. 1, multiple wordlines WL11 through WL14 and multiple memory cells M11 through M14 are illustrated. With selection transistors ST1 and ST2, the memory cells M11 through M14 constitute a string, and are serially connected between a bit line BL and a ground voltage VSS.

FIG. 1B is a circuit diagram illustrating a memory cell structure of a NOR type flash memory device. As illustrated in FIG. 1B, in the NOR type flash memory device, memory cells M21 through M25 and M22 through M26 are respectively connected between bit lines BL1 and BL2 and source lines CSL.

The above flash memory devices, particularly the NOR type flash memory device, can be used for the purpose of storing a code. In storing a code, it is important to have high operation speed without delay during a read operation. To this end, a wordline voltage applied to a wordline of a cell is always generated and retained, even in standby, during a read operation. The wordline voltage is provided as a power source voltage of a decoder (row decoder). Accordingly, when a command for a read operation is applied to the flash memory device, the read operation can be immediately operated without any delay to generate a high voltage wordline.

Meanwhile, one method of increasing the storage capacity of a flash memory device incorporates use of a multi-level cell (MLC) method. In the MLC method, one cell is programmed to have various threshold voltages to store two or more multi-bits in one memory cell, which is different from a single level cell (SLC) method, which only stores one bit in one memory cell.

For example, when two-bit data is stored in one MLC, four voltage thresholds are employed. Therefore, in order to read data stored in the cell, wordline voltages having three different levels are required. A stable read operation can be performed when the wordline voltages are maintained at uniform values.

FIG. 2A is a block diagram illustrating a portion of a flash memory device for explaining a conventional method of generating a wordline voltage. FIG. 2B is a waveform diagram for illustrating levels of wordline voltages that may be generated, in accordance with the conventional method.

As illustrated in FIG. 2A, a general memory device includes a wordline voltage generating unit 11, a switch unit 12, and a row decoder 13. The wordline voltage generating unit 11 generates one or more wordline voltages Vread 1 through Vread 3, usually by using a charge pump and a voltage regulator circuit (not shown). In a general voltage regulator circuit, a voltage higher than a target output voltage is used as a power source to provide a charge to an output end when the output voltage is lower than the target voltage to increase the output voltage. When the output voltage has approximately reached the target output voltage, charges are blocked to prevent further voltage increase.

In the above structure, when an output voltage is undesirably increased due to charge flowing to the output end, no measure for reducing the increased output voltage is provided. For example, wordline voltages Vread 1 through Vread 3, which are generated in the wordline voltage generating unit 11 for a read operation, are sequentially provided to the row decoder 13 by a switching operation of the switch unit 12. After the wordline voltage Vread 1 (having a low voltage level) through the wordline voltage Vread 3 (having a high voltage level) are sequentially switched, a parasitic capacitance Ca, which is present at an output node Na of the switch unit 12, obtains a voltage that corresponds to the wordline voltage Vread 3.

When a new read operation is performed, a charge sharing is generated between the parasitic capacitance Ca component of the node Na and a capacitance Cb component of an output node Nb of the wordline voltage Vread 1, thus minutely increasing the level of the wordline voltage Vread 1. That is, as illustrated in FIG. 2B, when the wordline voltage Vread 1 is generated at each cycle of the read operation, the level of the wordline voltage Vread 1 is continuously and minutely increased. Accordingly, the wordline voltage Vread 1 is not stably output.

Since the parasitic capacitance Ca of the output node Na is usually greater than a parasitic capacitance Cb of the node Nb, the aggregate increase in the wordline voltage level over a few read operations may not be significant. However, when the above process is continuously repeated, the wordline voltages, especially the wordline voltage Vread 1, may increase to the point that reliability of the read operations decrease.

SUMMARY

According to an aspect of the present invention, there is provided a flash memory device including a multi-level cell. The flash memory device includes a wordline voltage generating unit for generating at least one wordline voltage for read operations of the multi-level cell; a switch unit for receiving the at least one wordline voltage and an initialization voltage, and selectively outputting the at least one wordline voltage and the initialization voltage through a switching operation;

and a row decoder for operating the wordline of the multi-level cell based on an output of the switch unit.

The flash memory device may further include a control circuit that provides at least one control signal to the switch unit. The switch unit outputs the initialization voltage in at least one section of the read operation in response to the at least one control signal.

The switch unit may receive first through n-th wordline voltages for reading the multi-level cell, and output the initialization voltage after outputting at least one wordline voltage among the wordline voltages. The switch unit may output the initialization voltage after outputting a wordline voltage having the highest level among the wordline voltages.

The switch unit may receive first through third wordline voltages Vread 1, Vread 2 and Vread 3 for reading the multi-level cell, which stores two-bit data, where Vread 1<Vread 2<Vread 3. The switch unit may also perform, during one read cycle, a switching operation for sequentially outputting the first through third wordline voltages Vread 1, Vread 2 and Vread 3 and a switching operation for outputting the initialization voltage. The switch unit may output the initialization voltage after outputting the third wordline voltage Vread 3 and before outputting the first wordline voltage Vread 1, for example.

The initialization voltage may have a lower voltage level than that of the third wordline voltage Vread 3. Also, the initialization voltage may be a power source voltage (VDD) applied to the flash memory device, or the initialization voltage may be a ground voltage.

The switch unit may include a first switch unit for switching the at least one wordline voltage, and a second switch unit for switching the initialization voltage. The first switch unit may include first through n-th switches controlled by first through n-th control signals, respectively, for switching first through n-th wordline voltages of the at least one wordline voltage for reading the multi-level cell.

Also, the first switch unit may include first through third switches controlled by first through third control signals, respectively, for switching first through third wordline voltages Vread 1 through Vread 3 of the at least one wordline voltage for reading the multi-level cell. The multi-level cell may store two-bit data, and Vread 1 may be less than Vread 2, which may be less than Vread 3. The second switch unit may include a fourth switch controlled by a fourth control signal, for switching the initialization voltage.

In order to output the initialization voltage, the fourth control signal may be actualized in at least one section of one read cycle. Also, the first through third control signals may be sequentially actualized to sequentially output the first through third wordline voltages Vread 1 through Vread 3, and the fourth control signal may be actualized after the third control signal is actualized and before the first control signal is actualized.

According to another aspect of the present invention, there is provided a flash memory device, including a wordline voltage generator, first and second switches, a row decoder and a controller. The wordline voltage generator generates at least one wordline voltage for reading a memory cell. The first switch receives the wordline voltage to switch and output the wordline voltage to an output node. The second switch receives an initialization voltage to switch and output the initialization voltage to the output node. The row decoder is connected to the output node of the first and second switches, and drives a wordline of the memory cell. The controller generates a control signal for controlling the first and second switches, such that the initialization voltage is provided to the output node for initializing the output node after the wordline voltage is provided to the output node.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
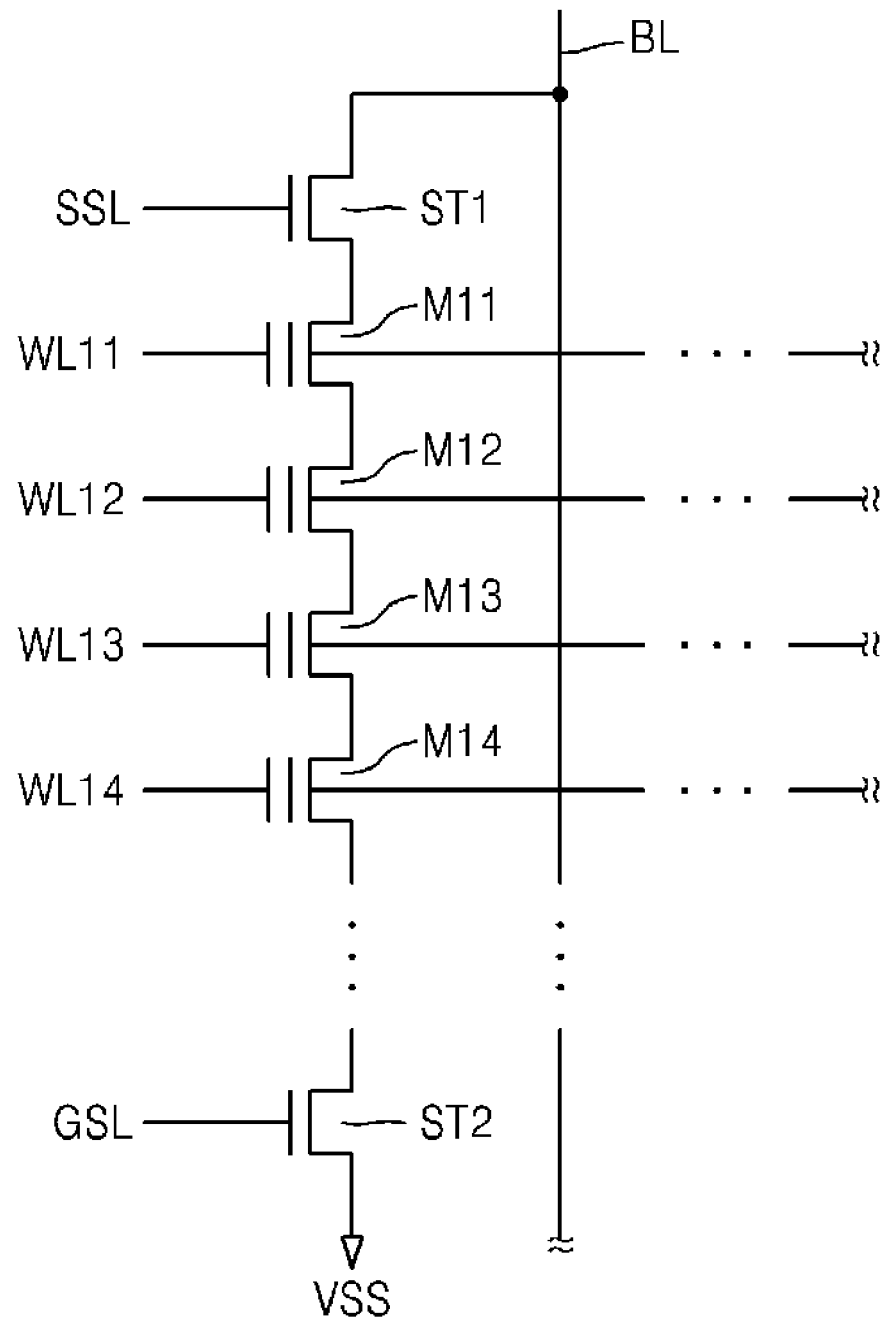
FIGS. 1A and 1B are circuit diagrams illustrating memory cell structures of general NAND type and NOR type flash memory devices.
Figure 1B:
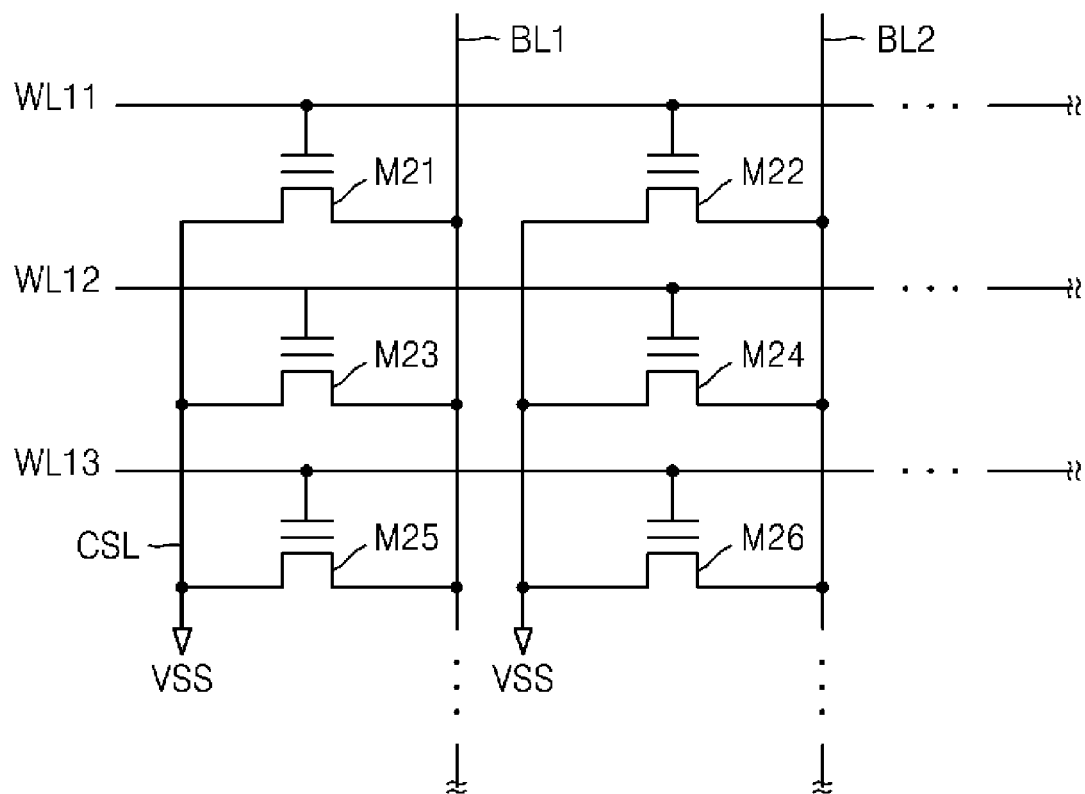
Figure 2A:
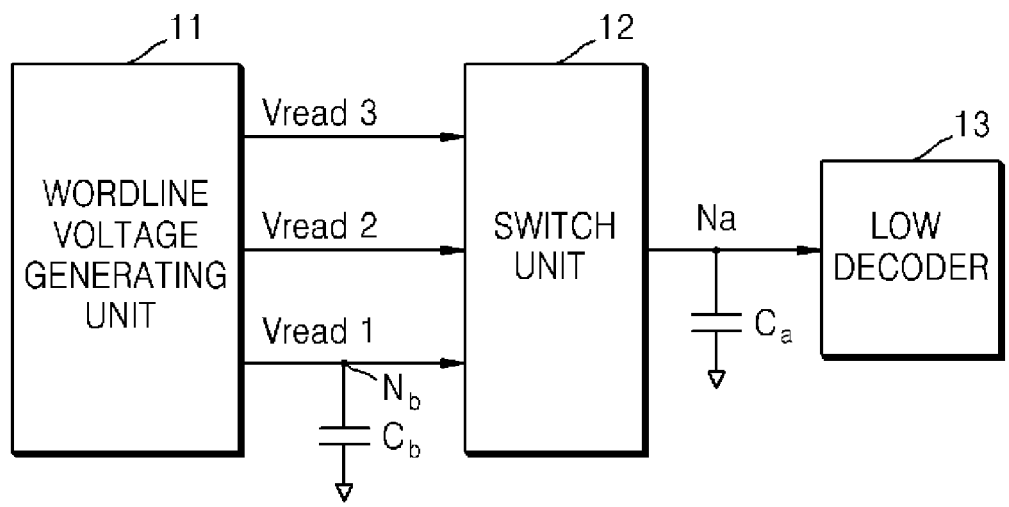
FIGS. 2A and 2B are a block diagram of a conventional flash memory device and a waveform diagram showing levels of wordline voltages of the flash memory device, respectively.
Figure 2B:
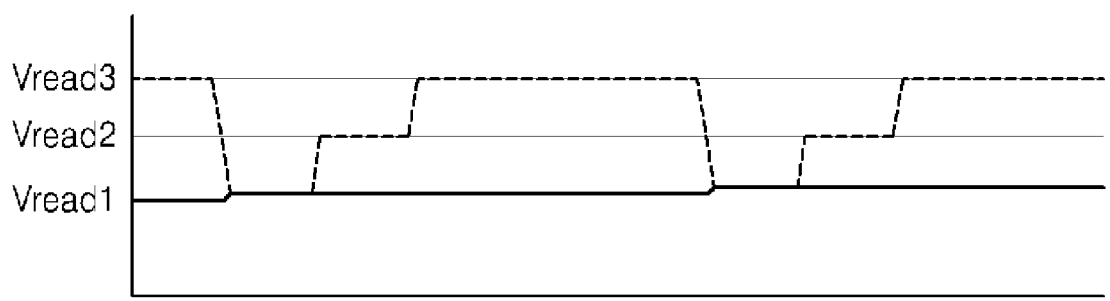

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Various embodiments of the present invention provide a flash memory device that has increased reliability with regard to read operations, and a method of driving the flash memory device. For example, the flash memory device is capable of stably generating a wordline voltage level.

Figure 3:
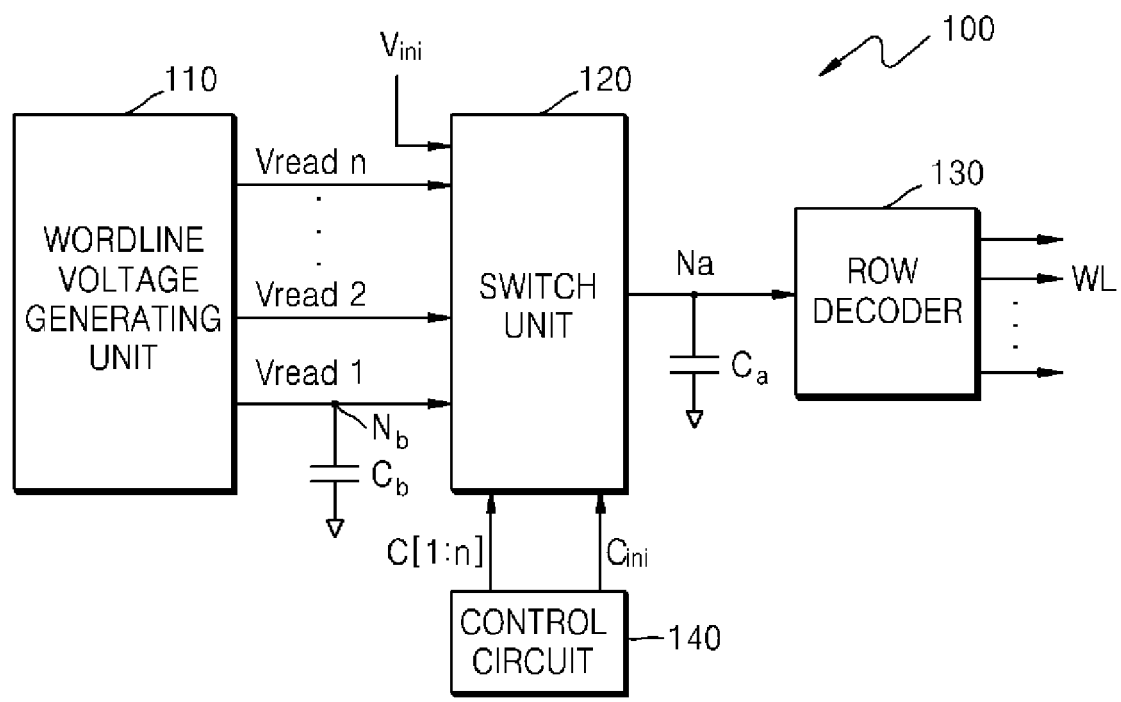
FIG. 3 is a block diagram illustrating a flash memory device, according to an embodiment of the present invention.

FIG. 3 is a block diagram showing a flash memory device 100, according to an illustrative embodiment of the present invention. As illustrated in FIG. 3, the flash memory device 100 may include a wordline voltage generating unit 110, a switch unit 120, and a row decoder 130. Also, the flash memory device 100 may include a control circuit 140 generating control signals C[1:n] and $C_{ini}$ for controlling switching operations of the switch unit 120.

The wordline voltage generating unit 110 generates a wordline voltage for driving a wordline of a memory cell (not shown) included in the flash memory device 100. Particularly when the memory cell includes a multi-level cell storing multiple-bit data in each cell, the wordline voltage generating unit 110 generates multiple wordline voltages Vread 1 through Vread n for reading the multi-level cell. For example, when a multi-level cell included in the flash memory device 100 stores two-bit data, the wordline voltage generating unit 110 generates three wordline voltages Vread 1 through Vread 3 to read the multi-level cell.

The at least one wordline voltages Vread 1 through Vread n generated from the wordline voltage generating unit 110 are provided to the switch unit 120. The switch unit 120 receives an initialization voltage Vini having a predetermined level in addition to the at least one wordline voltages Vread 1 through Vread n. The switch unit 120 selectively outputs the at least one wordline voltages Vread 1 through Vread n and the initialization voltage Vini through an output end at output node Na based on the switching operation. In an embodiment, the level of the initialization voltage Vini may be smaller than a wordline voltage among the at least one wordline voltages Vread 1 through Vread n having the greatest voltage level. A power source voltage VDD provided to the flash memory device 100 may be used as the initialization level Vini, for example. Also, a grounding voltage VSS may be used as the initialization voltage Vini.

The row decoder 130 drives a wordline of the memory cell using wordline voltages Vread 1 through Vread n which are selectively provided through the switch unit 120. That is, the row decoder 130 sequentially receives the wordline voltages Vread 1 through Vread n based on the output of the switch unit 120, thus providing the input wordline voltages Vread 1 through Vread n to wordlines of memory cells and reading data stored in the memory cells. For example, a first wordline voltage Vread 1 having a lowest level through an n-th wordline voltage Vread n having a highest level may be provided as wordlines of a memory cell.

Meanwhile, the switch unit 120 may further include a switch for switching the initialization voltage Vini in addition to a switch for switching the wordline voltages Vread 1 through Vread n. For example, the switch unit 120 may include n switches for switching n wordline voltages Vread 1 through Vread n, and further, an additional switch for switching the initialization voltage Vini.

The control circuit 140 generates control signals C[1:n] and Cini to control the switches of the switch unit 120. A control signal C[1:n] is a signal controlling the switch for switching wordline signals Vread 1 through Vread n, and a control signal Cini is a signal controlling the switch for switching the initialization signal Vini. In particular, the wordline voltages Vread 1 through Vread n are sequentially switched during one read cycle and provided to an output node Na, and the control circuit 140 performs control operations such that the initialization voltage Vini is provided to the output node Na in at least one section of the read cycle. The control circuit 140 may preferably perform control operations such that, when after a wordline voltage having a high voltage level is provided to the output node Na and a wordline voltage having a relatively low voltage level is provided to the output node Na, the initialization voltage Vini is provided to the output node Na, between the output of the wordline voltage having the high voltage level and the output of the wordline voltage having the low voltage level.

For example, when wordline voltages Vread 1 through Vread n are sequentially provided to the output node Na during one read cycle, a high voltage corresponding to the n-th wordline voltage Vread n may be stored in a parasitic capacitor Ca formed at the output Na. Then, when a first wordline voltage Vread 1 is provided during a next read cycle, a charge sharing is generated between the parasitic capacitor Ca of the output node Na and a node Nb outputting the first wordline voltage Vread 1, and thus the actual level of the first wordline voltage Vread 1 may be increased by a small degree from the target voltage level. Accordingly, it can be controlled such that the initialization voltage Vini is provided to the output node Na after the n-th wordline voltage Vread n is provided to the output node Na during the read cycle. Also, it can be controlled such that the initialization voltage Vini is provided to the output node Na before the first wordline voltage Vread 1 is provided to the output node Na during the read cycle.

The operation of the flash memory device 100 configured as shown in FIG. 3 is further described with reference to FIG. 4, which is a block diagram showing the wordline voltage generating unit and the switch unit of FIG. 3, according to an illustrative embodiment of the invention.

Figure 4:
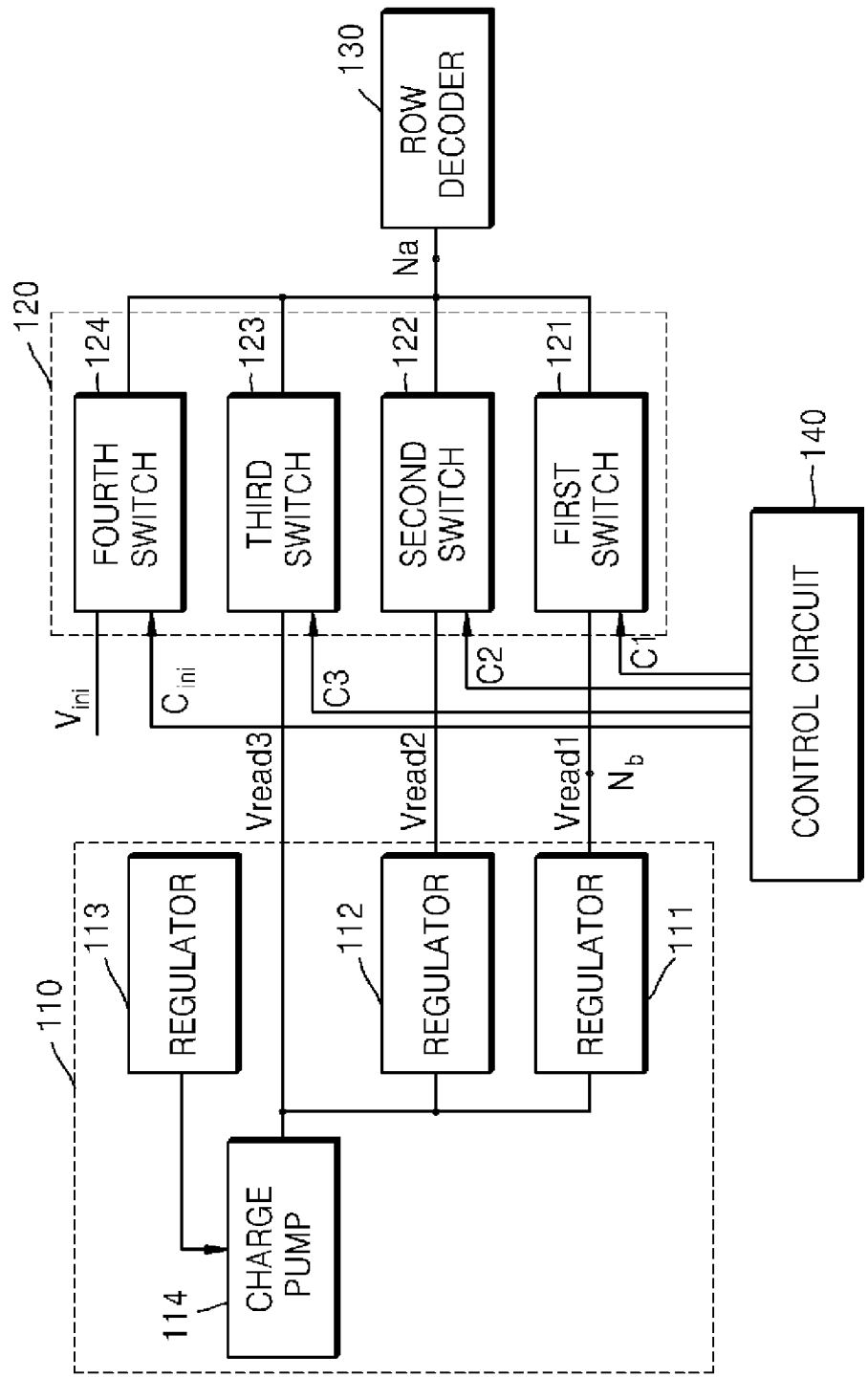
FIG. 4 is a block diagram illustrating a wordline voltage generating unit and a switch unit illustrated in FIG. 3, according to an embodiment of the present invention.

FIG. 4 illustrates multi-level cells storing two-bit data, although embodiments of the present invention are not limited to the depicted embodiment, and various modifications are possible.

As illustrated in FIG. 4, the wordline voltage generating unit 110 may include one or more regulators 111, 112, and 113 and a charge pump 114. The regulator 113 regulates a predetermined power source voltage VDD and outputs it. The output of the regulator 113 is provided to the charge pump 114, and the charge pump 114 generates a voltage having a high level based on a pumping operation and outputs the voltage, which may be used as a third wordline voltage Vread 3.

Meanwhile, the regulators 111 and 112 may generate a first wordline voltage Vread 1 and a second wordline voltage Vread 2, respectively, using the output of the charge pump 114. The first through third wordline voltages Vread 1 through Vread 3 which may be generated as described above are provided to the switch unit 120.

The switch unit 120 includes multiple switches. For example, the switch unit 120 may include a first switch unit (including the first through third switches 121, 122, and 123) for switching the first through third wordline voltages Vread 1 through Vread 3. In addition, the switch unit 120 may further include a second switch unit (including fourth switch 124). The first through fourth switches 121, 122, 123, and 124 are commonly connected to the output node Na.

Meanwhile, the control circuit 140 generates control signals C1, C2, C3, and Cini for controlling the first through fourth switches 121 through 124, respectively. For example, the control circuit 140 generates a first control signal C1 and provides it to the first switch 121, generates a second control signal C2 and provides it to the second switch 122, generates a third control signal C3 and provides it to the third switch 123, and generates a fourth control signal Cini and provides it to the fourth switch 124.

In an embodiment, the wordline voltage generating unit 110 can always generate and maintain the first through third wordline voltages Vread 1 through Vread 3, even in standby, so as to immediately perform a read operation without delay. Under the control of the control circuit 140, the switch unit 120 selectively provides the first through third wordline voltages Vread 1 through Vread 3 to the output node Na.

In order to read a multi-level cell storing two-bit data, during one read cycle, the first switch 121 is turned on in response to the first control signal C1, and the first wordline voltage Vread 1 having the lowest level is first selectively output to the output node Na. The row decoder 130 provides the first wordline voltage Vread 1 to a wordline of a memory cell, and a read operation is performed.

Then, in response to the second control signal C2, the second switch 122 is turned on and the second wordline voltage Vread 2 is provided to the row decoder 130, and a read operation of the memory cell is performed using the second wordline voltage Vread 2. Next, in response to the third control signal C3, the third switch unit 123 is turned on and the third wordline voltage Vread 3 is provided to the row decoder 130, and a read operation of the memory cell is performed using the third wordline voltage Vread 3. After one read cycle is performed, subsequent read cycles may be performed, and thus the switching operation of the wordline voltages as described above is performed for each subsequent read cycle.

Meanwhile, in response to the fourth control signal Cini in a predetermined section (or at a predetermined time) of the read cycle, the fourth switch 124 is turned on and thus an initialization voltage Vini is provided to the output node Na. For example, since a high voltage corresponding to the third wordline voltage Vread 3 is stored in a parasitic capacitor Ca of the output node Na after the third wordline voltage Vread 3 is selectively provided, the fourth control signal Cini may be activated after the third control signal C3 is activated during the read cycle. From another perspective, the above operation may also be described as the fourth control signal Cini being activated before the first control signal C1 is activated during the read cycle.

As described above, by setting the level of the initialization voltage Vini to be smaller than that of the third wordline voltage Vread 3, the level of a voltage stored in the parasitic capacitance Ca of the output node Na can be reduced, and accordingly, the level of the first wordline voltage Vread 1 can be prevented from becoming unstable. A power source voltage VDD or a ground voltage VSS may be used as the initialization Vini, for example.

Meanwhile, regarding FIG. 4, while the memory cell is being read, the first wordline voltage Vread 1 having a low level through the third wordline voltage Vread 3 having a high level are sequentially switched. However, the switching order is not limited. For example, when the switching operation is performed in the order of the second wordline voltage Vread 2, the first wordline voltage Vread 1, and the third wordline voltage Vread 3, the point at which the initialization voltage Vini is provided may differ. In particular, the initialization voltage Vini may be provided to the output node Na either after the second wordline voltage Vread 2 is provided to the output node Na or after the third wordline voltage Vread 3 is provided to the output node Na. Also, the initialization voltage Vini may be provided to the output node Na during one read cycle after both the second wordline voltage Vread 2 is output to the output node Na and the third wordline voltage Vread 3 is output to the output node Na.

Figure 5:
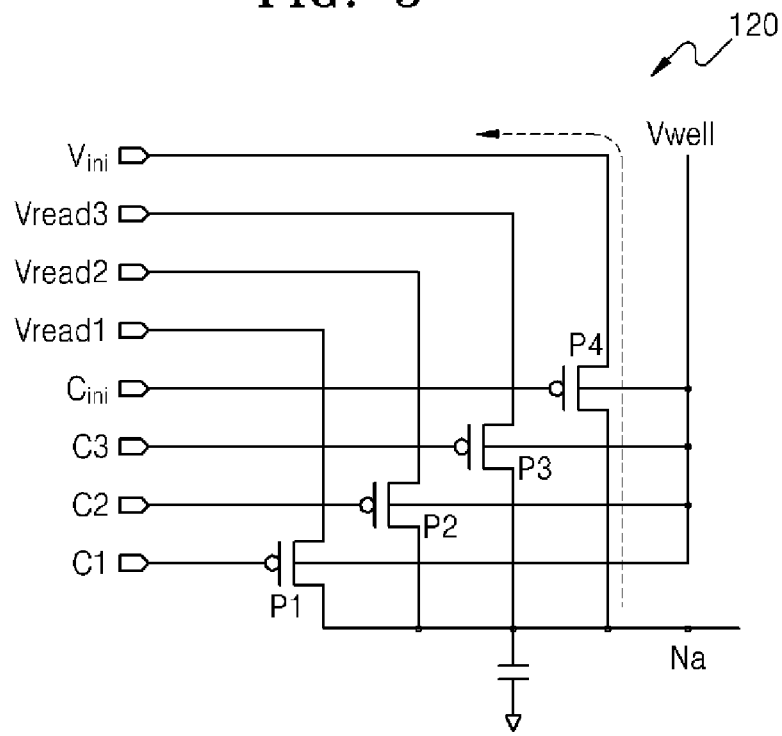
FIG. 5 is a circuit diagram illustrating an example of a switch unit of FIG. 3, according to an embodiment of the present invention.

FIG. 5 is a circuit diagram showing an example of the switch unit of FIG. 3, according to an illustrative embodiment of the invention. As illustrated in FIG. 5, each of the switches (e.g., first through fourth switches 121 through 124) in the switch unit 120 may include an NMOS transistor or a PMOS transistor. In FIG. 5, the switches 121 through 124 are depicted, for example, as PMOS transistors P1 through P4.

Figure 6A:
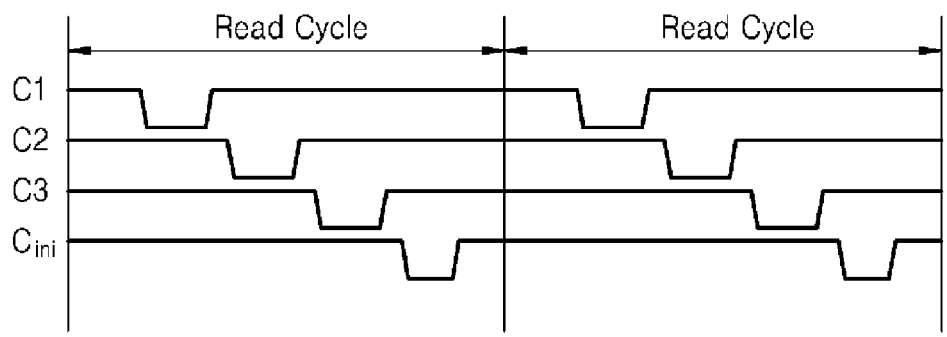
FIGS. 6A and 6B are waveform diagrams illustrating examples of control signals and wordline voltages illustrated in FIG. 3, respectively, according to an embodiment of the present invention.
Figure 6B:
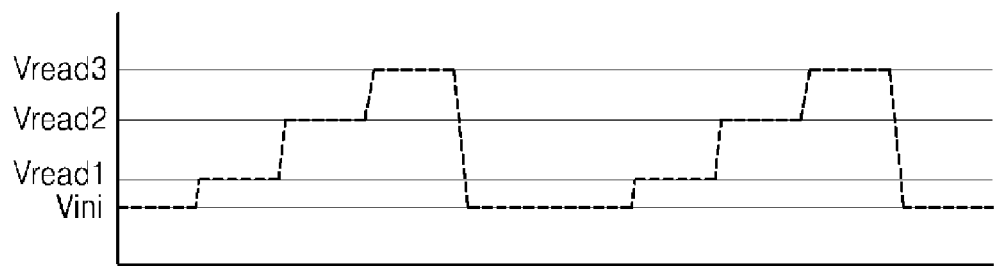

FIGS. 6A and 6B are waveform diagrams showing an example of control signals and wordline voltages illustrated in FIG. 3, according to an illustrative embodiment of the invention. First, as illustrated in FIG. 6A, during one read cycle, as the first control signal C1 has a low value, the first switch P1 is turned on, and the first wordline voltage Vread 1 connected to a source end of the first switch P1 is provided to the output node Na.

Likewise, as the second control signal C2 and the third control signal C3 sequentially have low values, the second switch P2 and the third switch P3 are sequentially turned on, and the second wordline voltage Vread 2 connected to a source end of the second switch P2 and the third wordline voltage Vread 3 connected to a source end of the third switch P3 are sequentially provided to the output node Na. After the third wordline voltage Vread 3 is output, as a fourth control signal Cini has a low value, the fourth switch P4 is turned on, and the initialization voltage Vini connected to a source end of the fourth switch P4 is provided to the output node Na.

FIG. 6B illustrates the levels of wordline voltages that are provided to the row decoder 130 through the operation described above with respect to FIG. 6A. As illustrated in FIG. 6B, the respective levels of the first through third wordline voltages Vread 1 through Vread 3 used for a read operation are stable, and in particular, the level of the first wordline voltage Vread 1 is stable.

Figure 7:
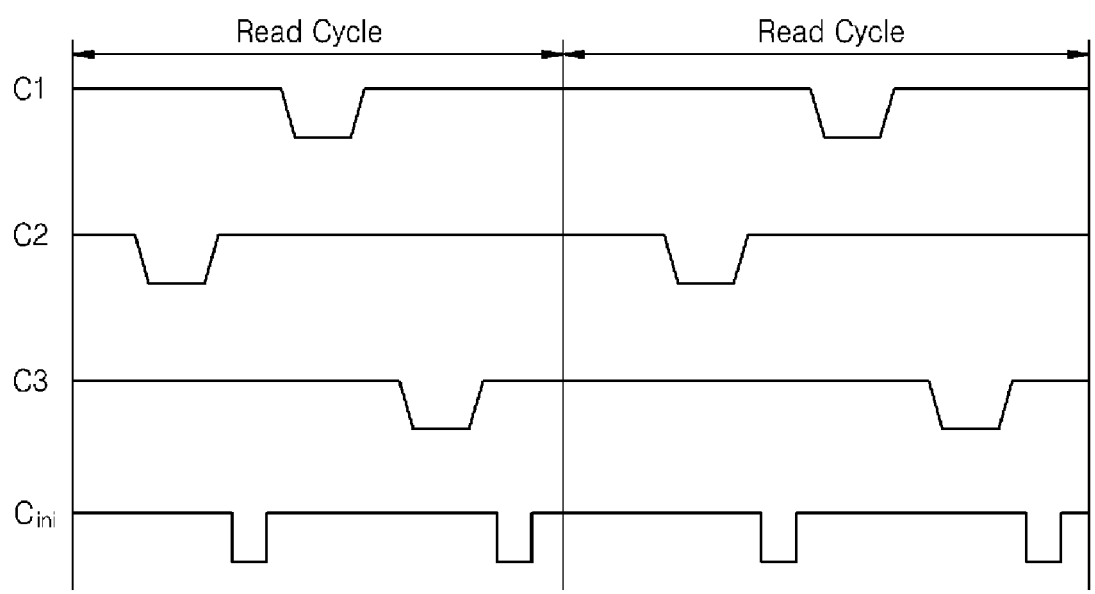
FIG. 7 is a waveform diagram illustrating an example of control signals of FIG. 3, according to an embodiment of the present invention.

FIG. 7 is a waveform diagram showing another example of control signals of FIG. 3, according to an illustrative embodiment of the invention. As illustrated in FIG. 7, in order to selectively output the initialization voltage Vini, the fourth control signal Cini can be activated in one or more sections of one read cycle. As described above, when a wordline voltage having a high level and a wordline voltage having a low level are sequentially output, the fourth control signal Cini can be activated after the WL voltage having the high level is output, and before the WL voltage having the low level is output.

The embodiments described above provide examples in which a multi-level cell stores two-bit data. However, the embodiments of the present invention are not limited by these examples, and can be applied to multi-level cells that store data having more than two bits. For example, when a multi-level cell stores three-bit data, the switch unit 120 receives five or more wordline voltages, such as seven wordline voltages, and performs a switching operation. In this respect, when a wordline voltage having a high level and then a wordline voltage having a low level are sequentially output, a control signal for selectively outputting an initialization voltage Vini is activated. Also, in such a case, the control signal can be activated at one or more times during one read cycle.

As described above, according to embodiments of the present invention, a wordline voltage for reading a memory cell can be stably generated, thereby increasing reliability of a read operation.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device including a multi-level cell, comprising:
   a wordline voltage generating unit generating a plurality of wordline voltages having different corresponding voltage levels for read operations of the multi-level cell, the plurality of wordline voltages comprising a first wordline voltage having a first voltage level, a second wordline voltage having a second voltage level higher than the first voltage level, and a third wordline voltage having a third voltage level higher than the second voltage level;
   a switch unit receiving the plurality of wordline voltages from the wordline voltage generating unit and an initialization voltage, and selectively outputting each of the plurality of wordline voltages and the initialization voltage through sequential switching operations to read the multi-level cell during a current read cycle, the switch unit comprising a plurality of first switches, respectively connected between the plurality of wordline voltages and an output node, and a second switch, connected between the initialization voltage and the output node; and
   a row decoder for operating the wordline of the multi-level cell based on an output of the switch unit, wherein the initialization voltage is provided to the output node immediately after each of the second wordline voltage and the third wordline voltage is provided to the output node during the current read cycle.

2. The flash memory device of claim 1, further comprising:
a control circuit providing a plurality of control signals to the switch unit, corresponding to the plurality of wordline voltages and the initialization voltage.

3. The flash memory device of claim 1, wherein the switch unit receives first through n-th wordline voltages for reading the multi-level cell, and outputs the initialization voltage after outputting each wordline voltage among the wordline voltages that has a voltage level greater than the first voltage level.

4. The flash memory device of claim 1, wherein the switch unit outputs the first wordline voltage after outputting the second wordline voltage and before outputting the third wordline voltage, and outputs the third wordline voltage and after outputting the first wordline voltage.

5. The flash memory device of claim 1, wherein the initialization voltage has a lower voltage level than that of the third wordline voltage.

6. The flash memory device of claim 5, wherein the initialization voltage comprises a power source voltage (VDD) applied to the flash memory device.

7. The flash memory device of claim 5, wherein the initialization voltage comprises a ground voltage.

8. The flash memory device of claim 3, wherein the plurality of first switches comprise first through n-th switches controlled by first through n-th control signals, respectively, for switching first through n-th wordline voltages of the plurality of wordline voltages for reading the multi-level cell.

9. The flash memory device of claim 1, wherein the plurality of first switches comprise first, second and third switches controlled by first, second and third control signals, respectively, for switching the first, second and third wordline voltages of the plurality of wordline voltages for reading the multi-level cell, where the multi-level cell stores two-bit data, and
wherein the second switch is controlled by a fourth control signal, for switching the initialization voltage.

10. The flash memory device of claim 9, wherein, in order to output the initialization voltage, the fourth control signal is actualized in at least two sections of each read cycle.

11. The flash memory device of claim 1, wherein a voltage level of the initialization voltage is set lower than the second voltage level of the second wordline voltage.

12. The flash memory device of claim 1, wherein the switch unit selectively outputs each of the plurality of wordline voltages and the initialization voltage through switching operations to read the multi-level cell during a next read cycle, following the current read cycle, and
wherein the initialization voltage is provided to the output node after each of the second wordline voltage and the third wordline voltage is provided to the output node during the next read cycle.

13. A flash memory device, comprising:
a wordline voltage generator generating a plurality of wordline voltages for reading a memory cell, the plurality of wordline voltages including a first wordline voltage having a first voltage level, a second wordline voltage having a second voltage level higher than the first voltage level, and a third wordline voltage having a third voltage level higher than the second voltage level;
a plurality of first switches respectively receiving the plurality of wordline voltages from the wordline voltage generator to switch and output each of the plurality of wordline voltages to an output node during one read cycle;
a second switch receiving an initialization voltage to switch and output the initialization voltage to the output node;
a row decoder connected to the output node of the first and second switches and driving a wordline of the memory cell; and
a controller generating a plurality of control signals for controlling the first and second switches, respectively, such that the initialization voltage is provided to the output node immediately after each of the second wordline voltage and the third wordline voltage is provided to the output node within the one read cycle.

14. The flash memory device of claim 13, wherein the multi-level cell stores two-bit data, and
wherein the first switch outputs the first wordline voltage after the second word line voltage is output during the one read cycle, and the second switch outputs the initialization voltage after the second wordline voltage is output and before the first wordline voltage is output.

15. The flash memory device of claim 14, wherein the initialization voltage has a lower voltage level than that of the second wordline voltage.

16. The flash memory device of claim 13, wherein a voltage level of the initialization voltage is set lower than the second voltage level of the second wordline voltage.

17. A flash memory device, comprising:
a wordline voltage generator generating a plurality of wordline voltages for reading a memory cell, the plurality of wordline voltages including a first wordline voltage having a first voltage level, a second wordline voltage having a second voltage level higher than the first voltage level, and a third wordline voltage having a third voltage level higher than the second voltage level;
a plurality of first switches respectively receiving the plurality of wordline voltages from the wordline voltage generator to switch and output each of the plurality of wordline voltages to an output node during one read cycle;
a second switch receiving an initialization voltage to switch and output the initialization voltage to the output node;
a row decoder connected to the output node of the first and second switches and driving a wordline of the memory cell; and
a controller generating a plurality of control signals for controlling the first and second switches, respectively, such that the initialization voltage is provided to the output node after the second wordline voltage is provided to the output node and after the third wordline voltage is provided to the output node within the one read cycle,
wherein the plurality of wordline voltages are used for reading a multi-level cell included in the memory cell, and
wherein the second switch outputs the initialization voltage in at least two sections of the one read cycle.

18. The flash memory device of claim 17, wherein a voltage level of the initialization voltage is set lower than the second voltage level of the second wordline voltage.

* * * * *